(12) United States Patent
Sasaki et al.

(10) Patent No.: US 9,110,124 B2
(45) Date of Patent: Aug. 18, 2015

(54) MAGNETIC SENSOR AND MAGNETIC DETECTION APPARATUS

(75) Inventors: Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 790 days.

(21) Appl. No.: 13/175,382

(22) Filed: Jul. 1, 2011

(65) Prior Publication Data

US 2012/0038355 A1   Feb. 16, 2012

(30) Foreign Application Priority Data

Aug. 10, 2010 (JP) ................................. 2010-179681

(51) Int. Cl.
  *H01L 29/82* (2006.01)
  *G01R 33/12* (2006.01)
  *G11C 11/16* (2006.01)

(52) U.S. Cl.
  CPC ............ *G01R 33/1284* (2013.01); *G11C 11/16* (2013.01)

(58) Field of Classification Search
  CPC ........ H01L 43/08; G11B 5/33; G11B 5/4946; G11C 11/16
  USPC ...... 257/E29.323, 421–427; 438/3; 365/71–173; 360/324–326
  See application file for complete search history.

(56) References Cited

U.S. PATENT DOCUMENTS

| | | | | |
|---|---|---|---|---|
| 4,258,279 A | * | 3/1981 | Hovorka | 310/155 |
| 4,603,365 A | * | 7/1986 | Nakamura | 362/55 |
| 5,712,612 A | * | 1/1998 | Lee et al. | 338/32 R |
| 5,747,997 A | * | 5/1998 | Dahlberg et al. | 324/252 |
| 6,665,152 B2 | | 12/2003 | Nemoto | |
| 6,917,088 B2 | | 7/2005 | Takahashi et al. | |
| 6,934,133 B2 | | 8/2005 | Hayakawa et al. | |
| 7,064,649 B2 | | 6/2006 | Schmollngruber et al. | |
| 7,140,094 B2 | | 11/2006 | Nemoto | |
| 7,253,995 B2 | | 8/2007 | Takahashi et al. | |
| 8,072,713 B2 | | 12/2011 | Yamada et al. | |
| 8,243,400 B2 | | 8/2012 | Ishikawa et al. | |
| 8,295,006 B2 | | 10/2012 | Sugano et al. | |

(Continued)

FOREIGN PATENT DOCUMENTS

| | | |
|---|---|---|
| JP | A-07-296340 | 11/1995 |
| JP | A-2002-298312 | 10/2002 |

(Continued)

OTHER PUBLICATIONS

Losantos et al. Magnetic-field sensor based on a thin-film SOI transistor. Sensors and Actuartors A 67 pp. 96-101 [1998].*

(Continued)

*Primary Examiner* — Matthew Landau
*Assistant Examiner* — Eric Ashbahian
(74) *Attorney, Agent, or Firm* — Oliff PLC

(57) ABSTRACT

A magnetic sensor is provided with a channel of a semiconductor, a first insulating film and a metal body arranged opposite to each other with the channel in between, a ferromagnet provided on the first insulating film, a first reference electrode connected to the metal body, a second reference electrode connected to the metal body, a magnetic shield covering a portion opposed to the ferromagnet in the channel, and a second insulating film provided between the channel and the magnetic shield. The magnetic shield has a through hole extending toward the portion opposed to the ferromagnet in the channel.

13 Claims, 13 Drawing Sheets

(56) References Cited

U.S. PATENT DOCUMENTS

| | | | |
|---|---|---|---|
| 2003/0123198 A1 | 7/2003 | Sugawara et al. | |
| 2003/0179510 A1 | 9/2003 | Hayakawa | |
| 2006/0103989 A1 | 5/2006 | Hayakawa | |
| 2007/0253116 A1 | 11/2007 | Takahashi | |
| 2009/0034131 A1 | 2/2009 | Yamada et al. | |
| 2009/0057654 A1* | 3/2009 | Saito et al. | 257/39 |
| 2009/0057793 A1* | 3/2009 | Koga | 257/421 |
| 2010/0007995 A1 | 1/2010 | Sasaki | |
| 2010/0119875 A1* | 5/2010 | Sasaki | 428/812 |
| 2010/0314702 A1* | 12/2010 | Sasaki et al. | 257/421 |
| 2011/0042720 A1* | 2/2011 | Jalil et al. | 257/194 |
| 2011/0204886 A1 | 8/2011 | Sasaki et al. | |
| 2011/0244268 A1 | 10/2011 | Sasaki | |
| 2012/0038355 A1 | 2/2012 | Sasaki et al. | |
| 2012/0074510 A1 | 3/2012 | Sasaki et al. | |

FOREIGN PATENT DOCUMENTS

| | | |
|---|---|---|
| JP | A-2003-069109 | 3/2003 |
| JP | A-2004-521513 | 7/2004 |
| JP | A-2007-299467 | 11/2007 |
| JP | A-2009-037702 | 2/2009 |

OTHER PUBLICATIONS

European Search Report issued in European Patent Application No. 11153309.7 dated Apr. 15, 2011.

Lou et al., "Electrical Detection of Spin Accumulation at a Ferromagnet-Semiconductor Interface," *Physical Review Letters*, 2006, vol. 96, pp. 176603-1 to 176603-4.

Tran et al., "Enhancement of the Spin Accumulation at the Interface Between a Spin-Polarized Tunnel Junction and a Semiconductor," *Physical Review Letters*, 2009, vol. 102, pp. 036601-1 to 036601-4.

Dash et al., "Electrical Creation of Spin Polarization in Silicon at Room Temperature," *Nature*, 2009, vol. 462, pp. 491-494.

Sasaki et al., "Comparison of Spin Signals in Silicon Between Nonlocal Four-Terminal and Three-Terminal Methods," *Applied Physics Letters*, 2011, vol. 98, pp. 012508-1 to 012508-3.

U.S. Appl. No. 13/017,935 filed in the name of Tomoyuki Sasaki et al. filed Jan. 31, 2011.

Office Action dated Jan. 24, 2013 issued in U.S. Appl. No. 13/017,935.

O.M.J. van't Erve, et al., "Electrical Injection and Detection of Spin-Polarized Carriers in Silicon in a Lateral Transport Geometry", Applied Physics Letters, US, vol. 91, Nov. 21, 2007, p. 212109-1-212109-3.

\* cited by examiner

MAGNETIC SENSOR AND MAGNETIC DETECTION APPARATUS

BACKGROUND OF THE INVENTION

1. Field of the Invention

The present invention relates to a magnetic sensor and magnetic detection apparatus using spins.

2. Related Background Art

It is recently known that spins injected from a ferromagnet into a nonmagnetic body are accumulated there and the spins are attenuated by an external magnetic field, as described in Non-patent Literature 1 (X. Lou et al., "Electrical Detection of Spin Accumulation at a Ferromagnet-Semiconductor Interface," PHYSICAL REVIEW LETTERS, The American Physical Society, May 5, 2006, 96, 176603-1 to 176603-4). It is also known that spins are accumulated in a semiconductor. The semiconductor for accumulation of spins is GaAs, for example, as employed in Non-patent Literature 2 (M. Tran et al., "Enhancement of the Spin Accumulation at the Interface between a Spin-Polarized Tunnel Junction and a Semiconductor," PHYSICAL REVIEW LETTERS, The American Physical Society, Jan. 23, 2009, 102, 036601-1 to 036601-4), or Si, for example, as employed in Non-patent Literature 3 (Saroj P. Dash et al., "Electrical creation of spin polarization in silicon at room temperature," NATURE, Macmillan Publishers Limited, Nov. 26, 2009, vol. 462, pp 491-494).

SUMMARY OF THE INVENTION

Incidentally, it is known that the spin accumulation is applied to magnetic sensors and there are desires for detection of a magnetic flux from a microscopic region. However, the conventional magnetic sensors using the spin accumulation failed to provide satisfactorily high output and there were desires for achievement of higher output. For achieving higher output, it is conceivable to increase the spin accumulation, but a detailed mechanism of accumulation of spins in the nonmagnetic body has not been clarified yet.

The present invention has been accomplished in order to solve the above problem and it is an object of the present invention to provide a magnetic sensor capable of detecting a magnetic flux from a microscopic region and providing satisfactorily higher output.

In order to solve the above problem, a magnetic sensor according to the present invention is one comprising: a channel composed of a semiconductor; a first insulating film and a metal body arranged opposite to each other with the channel in between; a ferromagnet provided on the first insulating film; a first reference electrode connected to the metal body; a second reference electrode connected to the metal body; a magnetic shield covering a portion opposed to the ferromagnet in the channel; and a second insulating film provided between the channel and the magnetic shield, wherein the magnetic shield has a through hole extending toward the portion opposed to the ferromagnet in the channel.

The foregoing ferromagnet functions as an electrode for injecting spins into the channel and also functions as an electrode for detecting spins in the channel. Spins are injected from the ferromagnet through the first insulating film into the channel. The inventors discovered that by employing the structure wherein the channel of the semiconductor was interposed between the first insulating film and the metal body, the spins injected into the channel were effectively accumulated in the channel. A detailed mechanism of increase in spin accumulation remains unknown. It is, however, considered that an energy barrier made at an interface to the first insulating film in the channel and an energy barrier made at an interface to the metal body in the channel contribute to the increase in spin accumulation in the channel. The magnetic sensor of the present invention achieves the increase in spin accumulation, thereby realizing the higher output of the magnetic sensor.

When an external magnetic field is applied to the channel through the through hole provided in the magnetic shield, an orientation of spins accumulated in the channel rotates around an axis of the applied magnetic field (so-called Hanle effect). On the other hand, when no external magnetic field is applied to the channel, the orientation of spins in the channel remains invariant and the spins are kept accumulated without change of the spin orientation in the channel. Therefore, voltage output or resistance output relative to the external magnetic field can be read by electrically connecting one of a current source and an output measuring device to the ferromagnet and the first reference electrode and electrically connecting the other of the current source and the output measuring device to the ferromagnet and the second reference electrode. For this reason, it becomes feasible to detect a value according to the degree of rotation of spins caused depending upon the magnitude of the external magnetic field. Accordingly, it becomes feasible to detect a magnetic flux from a microscopic region corresponding to the size of the through hole. Since on this occasion the magnetic flux can be detected without need for making the size of the ferromagnet finer, it also becomes feasible to suppress increase in device resistance due to miniaturization of the ferromagnet. Since the second insulating film is provided between the channel and the magnetic shield, it is feasible to prevent an electric current from flowing out to the magnetic shield.

A thickness of the channel is preferably not more than 10 nm. In this case, the spin accumulation in the channel increases more, so as to enable achievement of much higher output of the magnetic sensor.

A junction between the channel and the metal body is preferably a Schottky junction. In this case, spins are suitably accumulated in a region sandwiched in between the energy barrier made at the interface to the first insulating film in the channel and a Schottky barrier made at the interface to the metal body in the channel. For this reason, it is feasible to achieve higher output of the magnetic sensor.

An axis direction of the through hole is preferably nonparallel to a magnetization direction of the ferromagnet. As described above, when the external magnetic field is applied to the channel through the through hole, the orientation of the spins in the channel rotates around the axis of the applied magnetic field. If the axis direction of the through hole should be parallel to the magnetization direction of the ferromagnet, no rotation of the orientation of spins would occur with application of the external magnetic field, so as to make detection of magnetic flux difficult. Therefore, the aforementioned detection of magnetic flux can be suitably performed if the axis direction of the through hole is nonparallel to the magnetization direction of the ferromagnet.

Preferably, when viewed from an axis direction of the through hole, an entire cross section of the through hole is opposed to the channel. This allows more accurate reading of the external magnetic field from a desired region.

A material of the metal body is preferably Al, Gd, or Yb. A junction between the metal body composed of any one of these materials and the channel of the semiconductor is a Schottky junction. Therefore, these materials are suitably applicable to the metal body for accumulation of spins in the channel.

A material of the metal body is preferably CoFe or $Fe_3Si$. In this case, the spin accumulation in the channel can be improved by making the magnetization direction of the ferromagnet opposite to a magnetization direction of the metal body.

A material of the ferromagnet is preferably a metal selected from the group consisting of Cr, Mn, Co, Fe, and Ni; an alloy containing at least one element in the foregoing group; or a compound containing at least one element selected from the foregoing group, and at least one element selected from the group consisting of B, C, N, Si, and Ge. Since these materials are ferromagnetic materials with large spin polarizability, it is feasible to suitably realize a function as a spin injecting electrode or a spin receiving electrode.

A material of the channel is preferably a semiconductor containing any one of Si, Ge, GaAs, C, and ZnO. Since these semiconductors have a relatively long spin diffusion length, it is feasible to suitably accumulate spins in the channel.

A material of the first insulating film is preferably magnesium oxide, aluminum oxide, magnesium aluminum oxide, zinc oxide, or gallium oxide. Since these materials form a tunnel barrier between the first insulating film and the channel of the semiconductor, it becomes feasible to inject many spin-polarized electrons from the ferromagnet into the channel and thus to enhance the output of the magnetic sensor.

A magnetization direction of the ferromagnet is preferably fixed by an antiferromagnet provided on the ferromagnet. Since the antiferromagnet is exchange-coupled with the ferromagnet, it becomes feasible to provide the magnetization direction of the ferromagnet with unidirectional anisotropy. In this case, the ferromagnet is obtained with higher coercive force in one direction than in the case without the antiferromagnet.

The magnetic sensor preferably further comprises a permanent magnet which supplies to the through hole, a magnetic field in the same direction as an axis direction of the through hole. If the permanent magnet is not used to apply the magnetic field to the channel layer, a peak of output appears at zero of the external magnetic field as an object to be detected; whereas the peak position of output can be shifted by applying the magnetic field to the channel layer with the use of the permanent magnet, which allows the peak of output to appear at a nonzero point of the external magnetic field.

It is preferable to construct a magnetic detection apparatus comprising a plurality of magnetic sensors as defined above. In this case, outputs of the respective magnetic sensors can be summed up. The magnetic detection apparatus of this configuration is applicable, for example, to a biological sensor for detecting cancer cells or the like.

The present invention successively provides the magnetic sensor capable of detecting a magnetic flux from a microscopic region and providing higher output.

DESCRIPTION OF THE PREFERRED EMBODIMENTS

Figure 1:
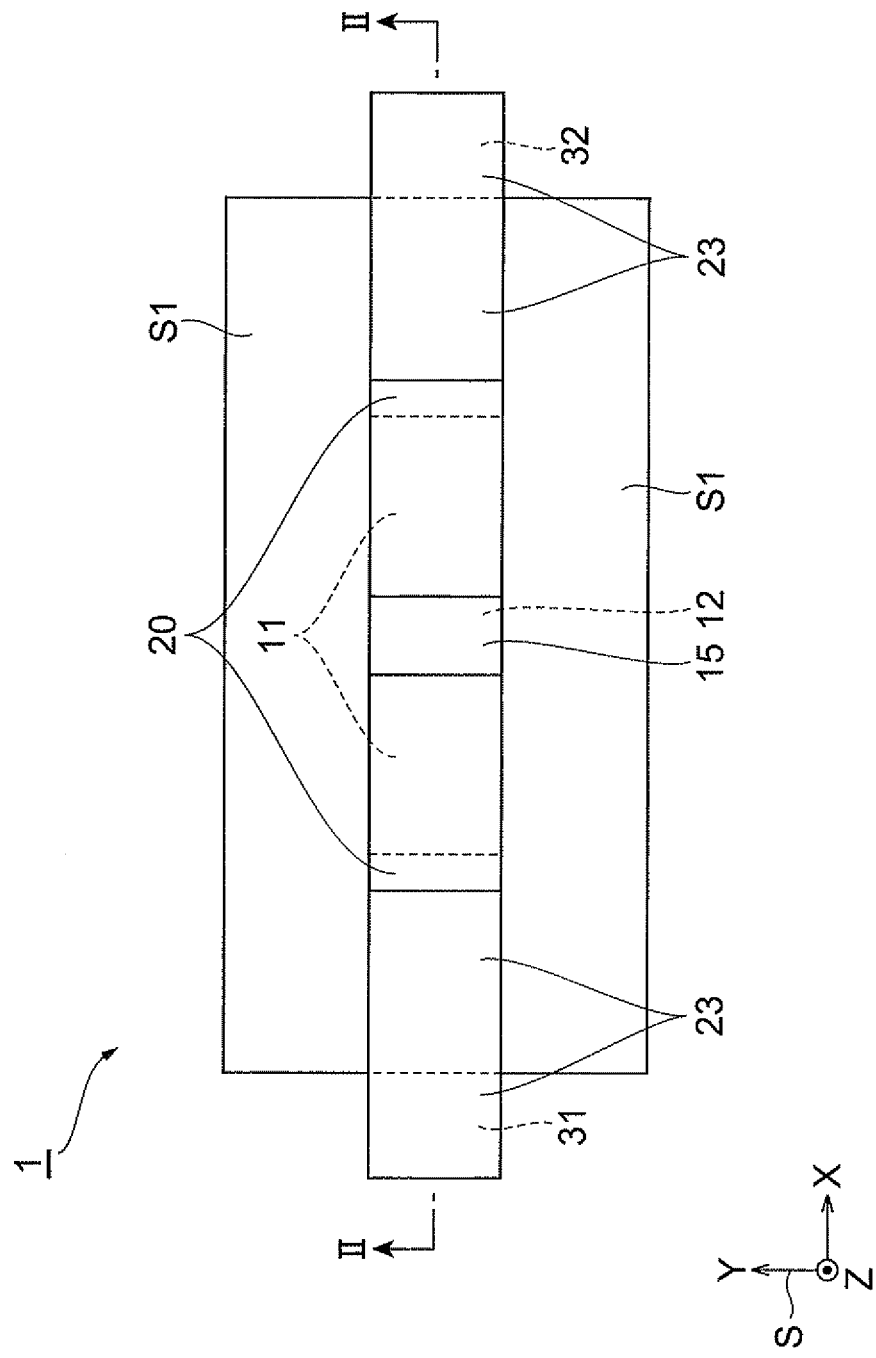
FIG. 1 is a top plan view of a magnetic sensor according to an embodiment of the present invention.
Figure 2:
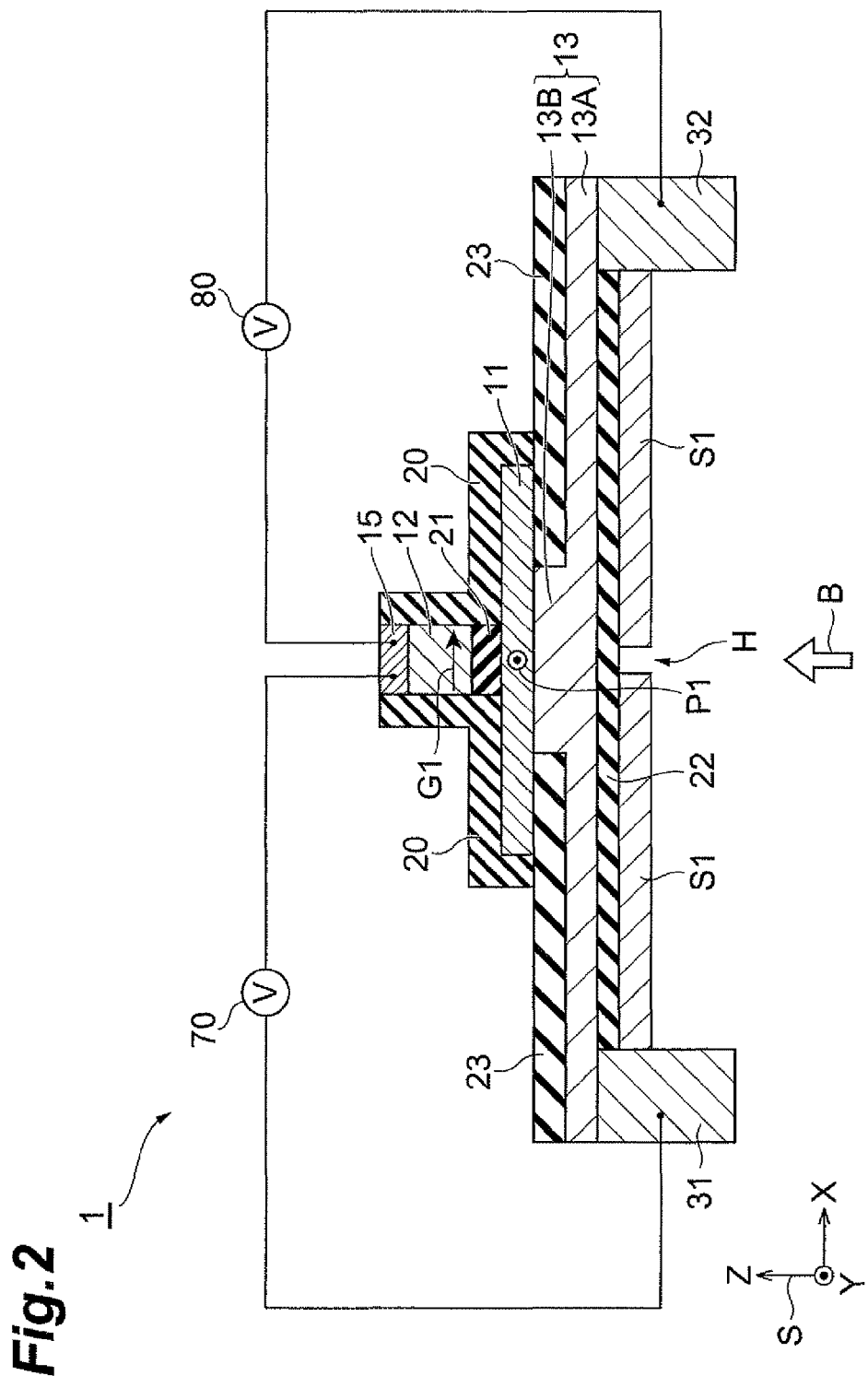
FIG. 2 is a cross-sectional view along the line 1141 in FIG. 1.
Figure 3:
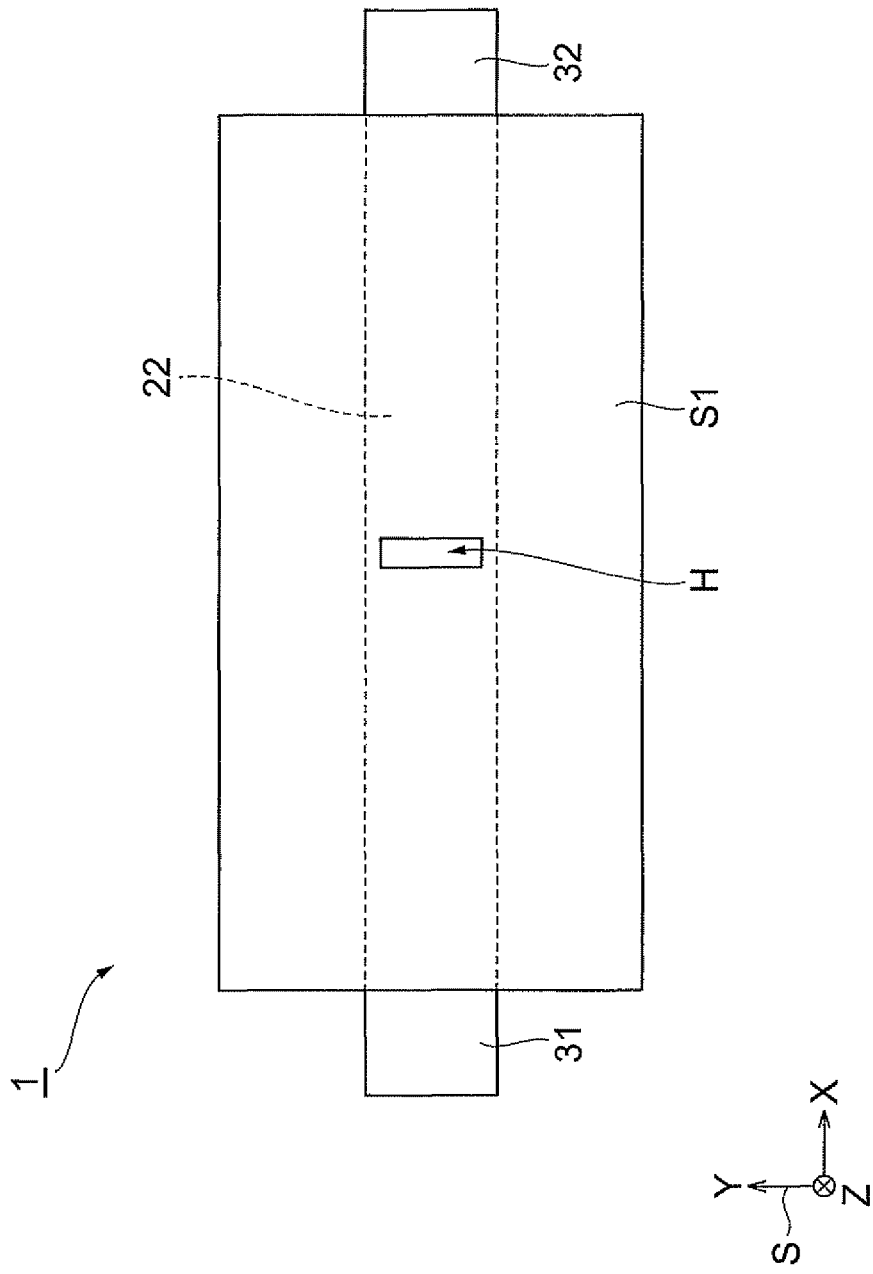
FIG. 3 is a bottom view of the magnetic sensor according to the embodiment.

The preferred embodiments of the magnetic sensor according to the present invention will be described below in detail with reference to the drawings. An XYZ orthogonal coordinate axis system S is shown on an as-needed basis in the drawings. FIG. 1 is a top plan view of the magnetic sensor according to an embodiment of the present invention. FIG. 2 is a cross-sectional view along the line II-II in FIG. 1. FIG. 3 is a bottom view of the magnetic sensor according to the present embodiment.

As shown in FIG. 2, the magnetic sensor 1 is provided with a channel layer 11, a ferromagnetic layer 12, a metal layer 13, an insulating film (first insulating film) 21, an insulating film (second insulating film) 22, a first reference electrode 31, a second reference electrode 32, and a magnetic shield layer S1. In the example shown in the same drawing, the magnetic sensor 1 detects an external magnetic field B in the Z-axis direction.

The channel layer 11 is a portion which accumulates spins injected from the ferromagnetic layer 12. As shown in FIG. 1, the channel layer 11 has a rectangular shape, when viewed from the thickness direction (Z-axis direction) of the channel layer 11. The thickness of the channel layer 11 (length in the Z-axis direction in the example shown in FIG. 2) is, for example, 25 nm. The channel layer 11 is composed of a semiconductor, preferably, a material with a long spin lifetime, e.g., a semiconductor containing or composed of any one of Si, Ge, GaAs, C, and ZnO. The channel layer 11 is doped with an ion to provide electroconductive nature, as needed, and an ion concentration is, for example, in the range of $1.0 \times 10^{15}$ to $1.0 \times 10^{22}$ $cm^{-3}$.

The ferromagnetic layer 12 functions as an electrode for injecting spins into the channel layer 11 and also functions as an electrode for detecting spins in the channel layer 11. The ferromagnetic layer 12 is provided through the insulating film 21 on the channel layer 11 and is disposed on the insulating film 21 opposed to the metal layer 13. In the example shown in FIG. 1, the ferromagnetic layer 12 has a rectangular parallelepiped shape with the major axis along the Y-axis direction. A material of the ferromagnetic layer 12 is, for example, a metal selected from the group consisting of Cr, Mn, Co, Fe, and Ni; an alloy containing at least one element in the foregoing group; or a compound containing at least one element selected from the foregoing group, and at least one element selected from the group consisting of B, C, N, Si, Ge, and Pt. A magnetization direction G1 of the ferromagnetic layer 12 (the X-axis direction in the example of FIG. 2) is preferably nonparallel to the direction of the external magnetic field B (the Z-axis direction in the example of FIG. 2).

The insulating film 21 is provided between the channel layer 11 and the ferromagnetic layer 12. The insulating film 21 is in contact with the channel layer 11 and the ferromagnetic layer 12. Since the insulating film 21 is so provided, it becomes feasible to inject many spin-polarized electrons from the ferromagnetic layer 12 into the channel layer 11 and thereby to increase the voltage output of the magnetic sensor 1. FIG. 1 shows the example wherein the insulating film 21 consists of a single layer, but the insulating film 21 may have a multilayer structure consisting of a plurality of layers. The insulating film 21 can be made, for example, of magnesium oxide, aluminum oxide, magnesium aluminum oxide, zinc oxide, or gallium oxide. From the viewpoints of suppressing increase in resistance and letting the insulating film function as a tunnel insulating film, the thickness of the insulating film 21 is preferably not more than 1.6 nm. Furthermore, the thickness of the insulating film 21 is preferably not less than 0.4 nm in view of the thickness of a monoatomic layer.

The metal layer 13 functions as a layer for letting the channel layer 11 suitably accumulate spins. The metal layer 13 is arranged opposite to the insulating film 21 with the channel layer 11 in between. The channel layer 11 is in contact with the metal layer 13 and the insulating film 21. There are no particular restrictions on the shape of the metal layer 13. In the example shown in FIG. 2, the metal layer 13 has a bottom portion 13A and a projecting portion 13B. The bottom portion 13A and projecting portion 13B have a rectangular parallelepiped shape with the major axis along the X-axis direction. The major axis of the projecting portion 13B is shorter than that of the bottom portion 13A. The projecting portion 13B extends so as to project from a central region of the bottom portion 13A toward the channel layer 11. The projecting portion 13B is arranged at a position opposite to the ferromagnetic layer 12 with the channel layer 11 and the insulating film 21 in between. When the metal layer 13 has the shape consisting of the bottom portion 13A and the projecting portion 13B in this manner, a through hole H can be accurately formed. A material of the metal layer 13 is, for example, Al, Gd, or Yb.

Examples of combinations of specific materials for the metal layer 13, the channel layer 11, the insulating film 21, and the ferromagnetic layer 12 include a structure of Al/Si (n-type, P-doped, P ion concentration: $5 \times 10^{18}$ $cm^{-3}$ or more)/MgO/Fe, a structure of Al/Si (n-type, P-doped, P ion concentration: $5 \times 10^{18}$ $cm^{-3}$ or more)/$Al_2O_3$/Fe, a structure of Al/Si (n-type, P-doped, P ion concentration: $5 \times 10^{18}$ $cm^{-3}$ or more)/$SiO_2$/Fe, and so on, which are named in the order of the layers. It is also possible to adopt structures obtained by replacing Si in each of the above structures with GaAs (n-type, Si-doped, Si ion concentration: $1 \times 10^{18}$ $cm^{-3}$ or more). Furthermore, it is also possible to adopt structures obtained by replacing Al in each of the above structures with Gd or Yb.

The first reference electrode 31 and the second reference electrode 32 are portions for making an electric current for detection flow to the ferromagnetic layer 12 and reading the output based on spins. Each of the first reference electrode 31 and the second reference electrode 32 is electrically connected to the metal layer 13. In the example shown in FIG. 2, the first reference electrode 31 and the second reference electrode 32 are arranged with a predetermined space between them on portions of a bottom face of the bottom portion 13A of the metal layer 13. The first reference electrode 31 and the second reference electrode 32 are composed of an electroconductive material, e.g., a low-resistance nonmagnetic metal such as Al.

The magnetic shield layer S1 covers a portion opposed to the ferromagnetic layer 12 in the channel layer 11. In the example shown in FIG. 2, the magnetic shield layer S1 covers a bottom face of the insulating film 22 so as to cover the channel layer 11 at least in part, with the insulating film 22 and the metal layer 13 in between. Examples of materials applicable to the magnetic shield layer S1 include soft magnetic materials such as alloys containing Ni and Fe, sendust, alloys containing Fe and Co, and alloys containing Fe, Co, and Ni.

As shown in FIG. 2, the magnetic shield layer S1 has the through hole H extending toward the portion opposed to the ferromagnetic layer 12 in the channel layer 11. The through hole H is a hole for applying the external magnetic field B to the channel layer 11. In the present embodiment, the through hole H is provided in the magnetic shield layer S1 arranged below the channel layer 11. When viewed from the direction of the axis of this through hole H (e.g., the Z-axis direction in the example of FIG. 2), the entire cross section of the through hole H is preferably opposed to the channel layer 11. Namely, the through hole H is kept from being located outside the channel layer 11, when viewed from the axis direction of the through hole H. This allows more accurate reading of the external magnetic field. The through hole H may have any of various shapes when viewed from the axis direction of the through hole H. In the example shown in FIG. 3, the through hole H has a rectangular shape. In this case, the length (length in the X-axis direction) of the short sides of the through hole H can be, for example, 0.01 μm to 0.3 μm and the length (length in the Y-axis direction) of the long sides thereof can be, for example, 0.01 μm to 1 μm. The through hole H extends vertically toward the channel layer 11.

The insulating film 22 is provided between the channel layer 11 (and metal layer 13) and the magnetic shield S1. For this reason, it is feasible to prevent an electric current from flowing out to the magnetic shield S1. In the example shown in FIG. 2, the insulating film 22 is provided between the bottom portion 13A of the metal layer 13 and the magnetic shield layer S1.

Furthermore, as shown in FIG. 2, the magnetic sensor 1 is provided with a protecting layer 15, an insulating film 20, and an insulating film 23. The protecting layer 15 has a function to prevent oxidation of the ferromagnetic layer 12 and a function to suppress lattice strain of the ferromagnetic layer 12. The protecting layer 15 is provided on the top face of the ferromagnetic layer 12. A material of the protecting layer 15 is, for example, Ti or Ta.

The insulating film 20 has functions to prevent the channel layer 11, insulating film 21, ferromagnetic layer 12, and protecting layer 15 from being exposed, and to electrically and magnetically isolate each of these layers. In the example shown in FIG. 2, the insulating film 20 is provided so as to cover each of side faces of the channel layer 11, insulating film 21, ferromagnetic layer 12, and protecting layer 15, and a part of the surface of the channel layer 11. For this reason, it is feasible to suppress scattering of spins in the channel layer 11 and to prevent leakage of spins and electric current. A material of the insulating film 20 is, for example, an insulating material such as silicon oxide.

The insulating film 23 has functions to prevent the channel layer 11 and the metal layer 13 from being exposed, and to electrically and magnetically isolate each of these layers. In the example shown in FIG. 2, the insulating film 23 is provided so as to cover a part of the bottom face of the channel layer 11, a part of the top face of the bottom portion 13A of the metal layer 13, and side faces of the projecting portion 13B. A material of the insulating film 20 is, for example, an insulating material such as silicon oxide.

The operational effect of the magnetic sensor 1 of the present embodiment will be described below using FIGS. 2 and 4. First, the magnetization direction G1 of the ferromagnetic layer 12 (X-axis direction in the example shown in FIG. 2) is fixed so as to be nonparallel to the magnetic field direction of the external magnetic field B (Z-axis direction in the example shown in FIG. 2). Next, the ferromagnetic layer 12 and the first reference electrode 31 are connected to a current source 70 to let an electric current for detection flow to the ferromagnetic layer 12. Then electrons with spins oriented in a direction corresponding to the direction G1 of the magnetization of the ferromagnetic layer 12 are injected into the channel layer 11.

When the external magnetic field B is not applied to the channel layer 11 or when the external magnetic field B is zero, the orientation of spins of electrons in the channel layer 11 does not rotate. Therefore, the spins in the same direction as the preset direction G1 of magnetization of the ferromagnetic layer 12 are detected by the ferromagnetic layer 12. Accordingly, the resistance output or voltage output takes an extremum when the external magnetic field B is zero. The output can take a maximum or a minimum depending upon the directions of the electric current and the magnetization. The output can be evaluated with an output measuring device such as a voltage measuring device 80 connected to the ferromagnetic layer 12 and the second reference electrode 32.

In contrast to it, let us consider a case where the external magnetic field B is applied through the through hole H of the magnetic shield S1 to the channel layer 11. When the external magnetic field B is applied, the orientation of spins injected into the channel layer 11 rotates around the axis direction of the external magnetic field B (the Z-axis direction in the example shown in FIG. 2) (so-called Hanle effect). The example shown in FIG. 2 shows a state in which the orientation of the rotated spins P1 is directed along the Y-axis direction. The voltage output or resistance output at the interface between the channel layer 11 and the ferromagnetic layer 12 is determined by a relative angle between the orientation of the rotated spins P1 and the preset direction G1 of the magnetization of the ferromagnetic layer 12, i.e., the orientation of spins of electrons therein. When the external magnetic field B is applied, the orientation of spins in the channel layer 11 rotates and thus does not agree with the direction G1 of magnetization of the ferromagnetic layer 12. Therefore, the resistance output or voltage output becomes not more than a maximum with application of the external magnetic field B in the case where the output takes the maximum with the external magnetic field B being zero; the output becomes not less than a minimum with application of the external magnetic field B in the case where the output takes the minimum with the external magnetic field B being zero.

In this magnetic sensor 1, therefore, a peak of output appears at zero of the external magnetic field B and the output decreases with increase or decrease of the external magnetic field B. Namely, since the output varies depending upon values of the external magnetic field B, the magnetic sensor 1 of the present embodiment can be used as a magnetic detection device. In this manner, it becomes feasible to detect a fine magnetic flux corresponding to the size of the through hole H, using the through hole H formed in the magnetic shield layer S1. On this occasion, since the resolution is determined by the size of the through hole H, the magnetic flux can be detected from the microscopic region, without need for making the size of the ferromagnetic layer 12 finer. Therefore, it also becomes feasible to suppress increase in device resistance due to miniaturization of the ferromagnetic layer 12.

In the conventional magnetic sensor using spins, the output peak appeared depending upon a relative angle between magnetization directions of a magnetization free layer and a magnetization pinned layer in a parallel or antiparallel state, whereas in the magnetic sensor 1 of the present invention the output peak appears at zero of the external magnetic field B as described above. Therefore, for example, in a case where the magnetic sensor of the present invention is applied to a magnetic head or the like to read the timing of change between positive and negative of the external magnetic field, the output peak appears at zero of the external magnetic field B and it can be thus determined that the external magnetic field is reversed at that point.

Figure 4:
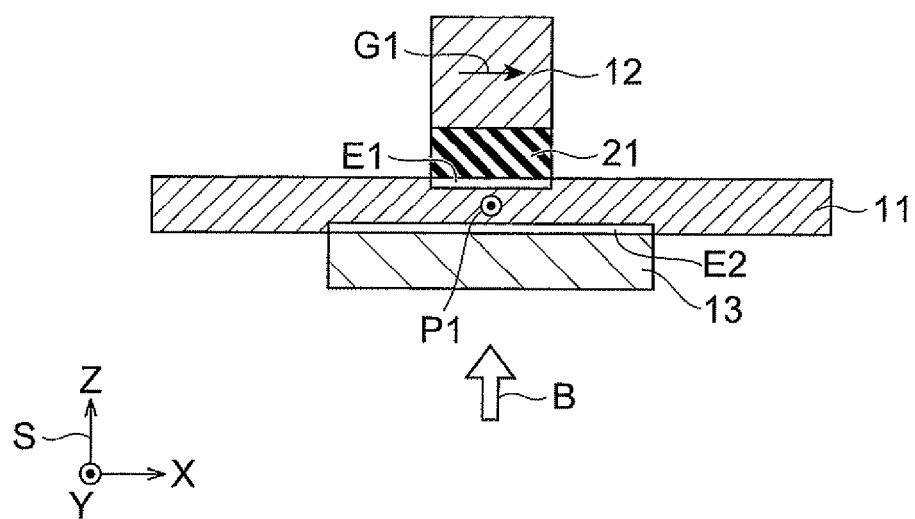
FIG. 4 is a schematic diagram for explaining the effect of the present invention.

FIG. 4 is a schematic diagram for explaining the effect of the present invention. The inventors discovered that when the magnetic sensor 1 for detection of output as described above was constructed in the structure in which the channel layer 11 of a semiconductor was sandwiched in between the insulating film 21 and the metal layer 13, spins injected into the channel layer 11 were effectively accumulated in the channel layer 11. A detailed mechanism of increase in spin accumulation is not clarified yet. It is, however, considered that an energy barrier (E1 conceptually indicated in FIG. 4) at the interface to the insulating film 21 in the channel layer 11 and an energy barrier (E2 conceptually indicated in FIG. 4) at the interface to the metal layer 13 in the channel layer 11 contribute to the increase in spin accumulation in the channel layer 11. Namely, it is presumed that in the structure in which the metal layer 13, the channel layer 11, the insulating film 21, and the ferromagnetic layer 12 are layered in this order as in the magnetic sensor 1 of the present embodiment, the channel layer 11 is sandwiched in between the energy barriers E1, E2, whereby spins are effectively accumulated in the channel layer 11. Therefore, the spin accumulation increases in the magnetic sensor 1, so as to enable achievement of higher output.

The junction between the metal layer 13 and the channel layer 11 is preferably a Schottky junction. In this case, spins are suitably accumulated in a region between the energy barrier at the interface to the insulating film 21 in the channel layer 11 and a Schottky barrier at the interface to the metal layer 13 in the channel layer 11. For this reason, it is feasible to achieve higher output of the magnetic sensor 1. The metal layer 13 may be in ohmic contact with the channel layer 11 and in this case, a small Schottky barrier exists at the interface to the metal layer 13 in the channel layer 11.

The above detailed the preferred embodiment of the present invention, but the present invention is not limited only to the above embodiment. The material of the metal layer 13 may be, for example, CoFe or $Fe_3Si$. These ferromagnetic materials are suitable for the metal layer 13 for accumulation of spins in the channel layer 11 of the semiconductor. When the material of the metal layer 13 is a ferromagnetic material as in this case, the spin accumulation in the channel layer 11 is improved by making the magnetization direction of the ferromagnetic layer 12 reverse to the magnetization direction of the metal layer 13. In this case, for example, in the magnetic sensor 1 shown in FIG. 2, an antiferromagnetic layer may be provided on the ferromagnetic layer 12 to fix the direction of magnetization of the ferromagnetic layer 12.

The thickness of the channel layer 11 is more preferably not more than 10 nm and in this case, the spin accumulation in the channel layer 11 further increases, so as to enable achievement of much higher output of the magnetic sensor 1.

As described above, when the external magnetic field B is applied through the through hole H to the channel layer 11, 11a, the orientation of spins injected into the channel layer 11, 11a rotates around the axis of the applied magnetic field. If the axis direction of the through hole is parallel to the magnetization direction of the ferromagnetic layer, no rotation of the orientation of spins occurs with application of the external magnetic field and it is thus difficult to detect a magnetic flux. Therefore, the detection of the magnetic flux as described above can be suitably performed when the axis direction of the through hole H is nonparallel to the magnetization direction of the ferromagnetic layer 12, 12a.

Figure 5:
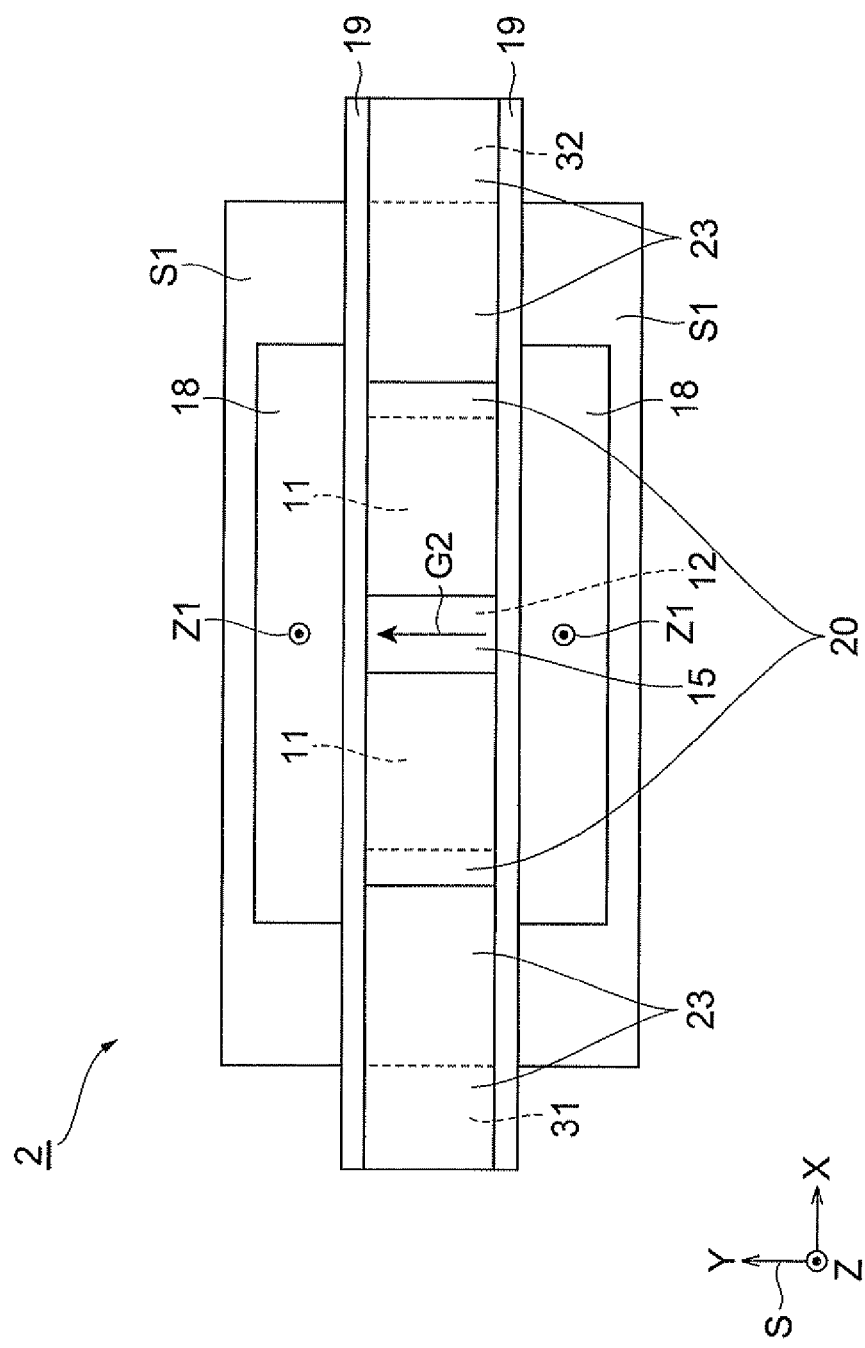
FIG. 5 is a top plan view showing an example in which the magnetic sensor is provided with permanent magnets.

The magnetic sensor preferably further comprises a permanent magnet for supplying to the through hole H, a magnetic field in the same direction as the axis direction of the through hole H. FIG. 5 is a top plan view of magnetic sensor 2. The magnetic sensor 2 is different from the magnetic sensor 1 in that the magnetic sensor 2 further comprises a pair of permanent magnets 18, 18 and a pair of insulating films 19, 19. The pair of permanent magnets 18, 18 are arranged opposite to each other with the pair of insulating films 19, 19 covering the two side faces of the channel layer 11, in between. The permanent magnets 18, 18 generate a magnetic field Z1 in the same direction as the axis direction (±Z-axis directions in this example) of the through hole H in the magnetic shield layer S1 to apply the magnetic field in the same (±Z-axis) direction as the axis direction of the through hole H to the channel layer 11. In this example, the magnetization direction G2 of the ferromagnetic layer 12 is assumed to be the Y-axis direction. When the permanent magnets 18, 18 are not used to apply the magnetic field to the channel layer 11, the peak of output appears at zero of the external magnetic field as an object to be detected; whereas the peak of output can be shifted at a nonzero point of the external magnetic field, with application of the magnetic field to the channel layer 11 through the use of the permanent magnets 18, 18. In order to avoid magnetic coupling between the ferromagnetic layer 12 and the permanent magnets 18, 18, the ferromagnetic layer 12 is arranged with a space from each permanent magnet 18.

Figure 6:
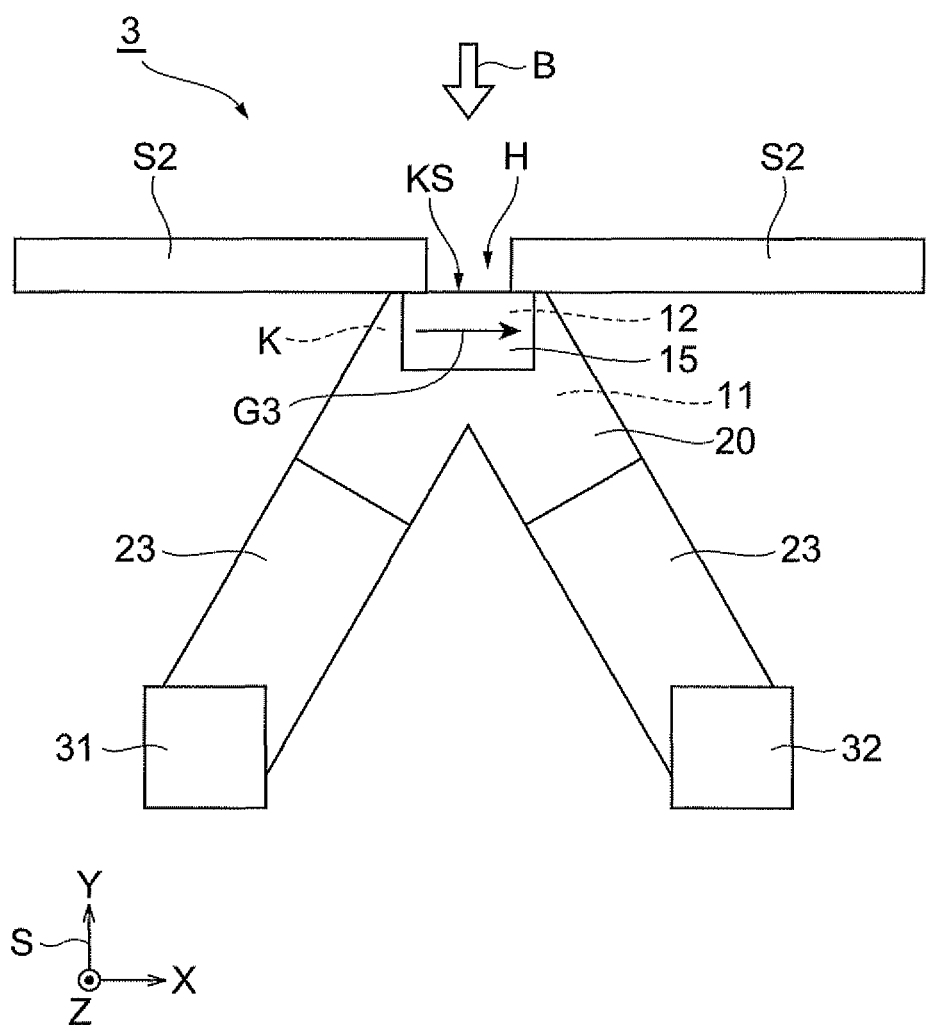
FIG. 6 is a top plan view showing modification example 1 of the magnetic sensor.

The shape of the channel layer 11, which is viewed from the thickness direction thereof, may be any other shape than the rectangular shape. FIG. 6 is a top plan view showing modification example 1 of the magnetic sensor. In the magnetic sensor 3 shown in FIG. 6, when viewed from the thickness direction (Z-axis direction) of the channel layer 11, the channel layer 11 has a bent shape. In this example, the magnetic sensor 3 detects the external magnetic field B in the Y-axis direction and the magnetization direction G3 of the ferromagnetic layer 12 is fixed in the X-axis direction. As shown in the same drawing, the through hole H may be formed in a magnetic shield layer S2 covering a side face of the channel layer 11. The through hole H is suitably arranged opposite to an outside face KS of the bent portion K of the channel layer 11 having the bent shape. Since the channel layer 11 is bent and the through hole H is arranged opposite to the outside face KS of the bent portion K of the bent shape as described above, a reading region of a magnetic flux such as the external magnetic field B can be made compact. Although not shown in FIG. 6, the shape of the metal layer 13 viewed from the thickness direction is also preferably a bent shape. A preferred configuration is such that the outside face KS of the bent portion K of the channel layer 11 is flat and the magnetic shield layer S2 is formed along this outside face KS. This makes the face for reading of the external magnetic field B flat and makes it easy to detect the magnetic field, for example, by making this flat face opposed to a reading target surface of a recording medium or the like.

Figure 7:
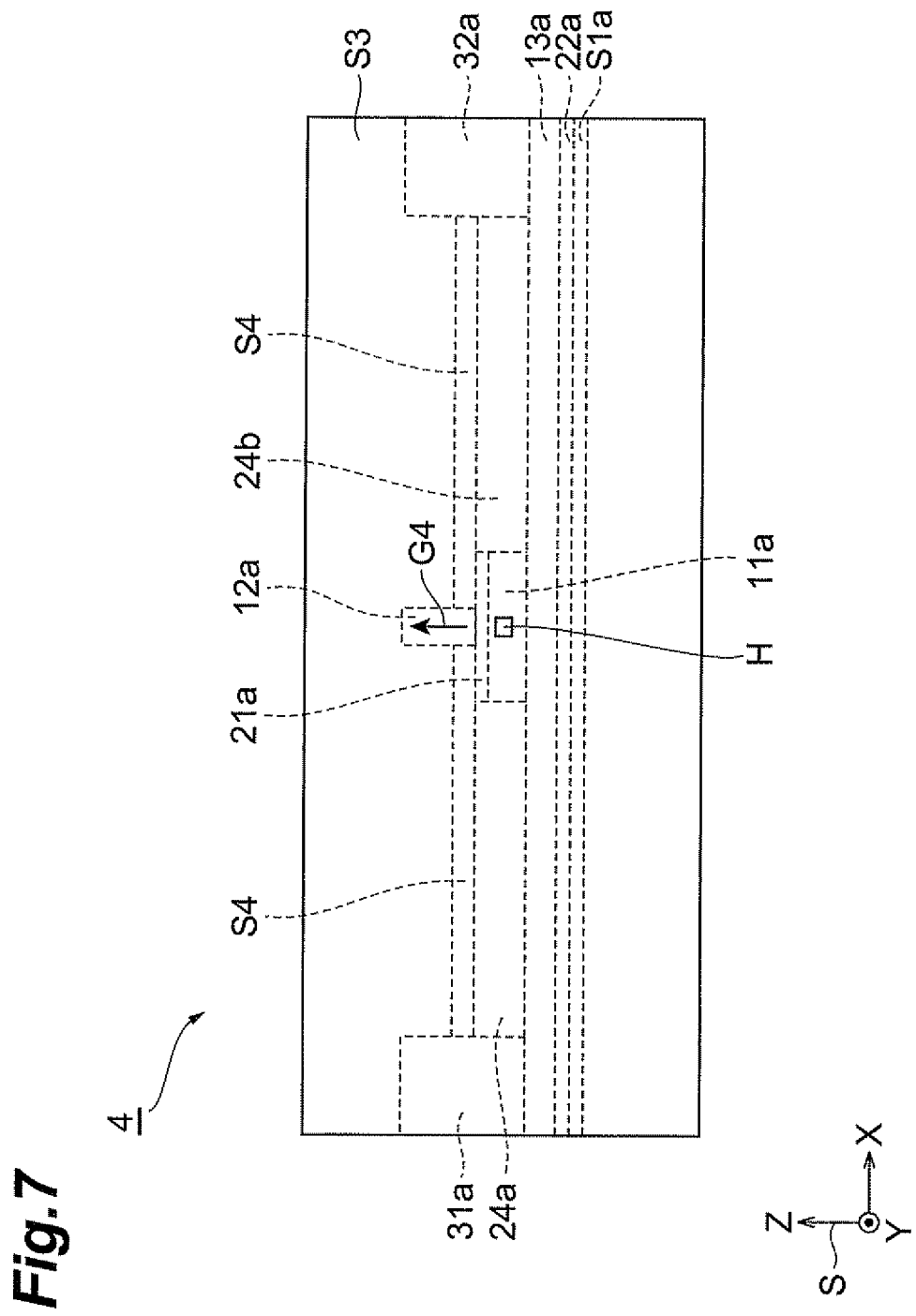
FIG. 7 is a cross-sectional view showing modification example 2 of the magnetic sensor.

FIG. 7 is a cross-sectional view showing modification example 2 of the magnetic sensor. The magnetic sensor 4 shown in FIG. 7 is different in the arrangement of the channel layer, ferromagnetic layer, metal layer, insulating films, first reference electrode, second reference electrode, and magnetic shield layer from the magnetic sensor 1. The present example shows a configuration wherein the magnetic sensor 4 detects the external magnetic field in the Y-axis direction. The magnetic sensor 4 is provided with a channel layer 11a composed of a semiconductor, a ferromagnetic layer 12a, a metal layer 13a, insulating films 21a, 22a, 24a, 24b, a first reference electrode 31a, a second reference electrode 32a, and magnetic shield layers S1a, S3, S4. The insulating film (first insulating film in this example) 21a and the metal layer 13a are arranged opposite to each other with the channel layer 11a in between. The ferromagnetic layer 12a is provided on the insulating film 21a opposed to the metal layer 13a. The first reference electrode 31a and the second reference electrode 32a are provided on the metal layer 13a, so as to be connected to the metal layer 13a. The magnetic shield layer S3 covers a portion opposed to the ferromagnetic layer 12a in a side face of the channel layer 11a. Since the insulating film (second insulating film in this example) is further provided between the side face of the channel layer 11a and the magnetic shield layer S3, it can prevent spins or electric current from flowing out to the magnetic shield layer S3. The magnetic shield layer S3 has a through hole H extending toward the portion opposed to the ferromagnetic layer 12a in the side face of the channel layer 11a. This allows the external magnetic field in the Y-axis direction to be read from the side face of the channel layer 11a. In this case, the magnetization direction of the ferromagnetic layer 12 (Z-axis direction in the example of FIG. 7) G4 is also preferably nonparallel to the magnetic field direction of the applied external magnetic field (Y-axis direction in this example).

Furthermore, the insulating film 24a is provided on a top face of the metal layer 13a and between the channel layer 11a and the first reference electrode 31a. The insulating film 24b is provided on the top face of the metal layer 13a and between the channel layer 11a and the second reference electrode 32a. The channel layer 11a is surrounded by the insulating film 21a provided on the top face of the channel layer 11a, the insulating film 24a and insulating film 24b provided with the channel layer 11a in between, and the metal layer 13a provided on the bottom face of the channel layer 11a. In order to prevent an excessive magnetic field from entering from the bottom and top of the channel layer 11a, the magnetic shield layer S1a is provided below the channel layer 11a and the magnetic shield layer S4 is provided above the channel layer 11a. Furthermore, the insulating film 22a is provided so as to cover the bottom face of the metal layer 13a and the magnetic shield layer S1a covers the bottom face of the insulating film 22a. The magnetic shield layer S4 covers the top faces of the insulating films 24a, 24b and the top face of the insulating film 21a. The magnetic sensor 4 of this configuration also allows spins injected into the channel layer 11a to be effectively accumulated in the channel layer 11a because the channel layer 11a of the semiconductor has the structure in which it is sandwiched in between the insulating film 21a and the metal layer 13a. For this reason, it becomes feasible to achieve higher output.

The magnetization direction of the ferromagnetic layer 12, 12a may be fixed by an antiferromagnetic layer provided on the ferromagnetic layer 12, 12a. In this case, the ferromagnetic layer 12, 12a obtained is one with higher coercive force in one direction than in the case without the antiferromagnetic layer. The magnetic field for fixing the magnetization direction of the ferromagnetic layer 12, 12a is preferably stronger than the external magnetic field B as an object to be evaluated. This allows the external magnetic field B to be detected on a stable basis. The direction of the magnetization of the ferromagnetic layer 12, 12a may be parallel to the surface opposed to the channel layer 11 as in FIGS. 2 and 6, or may be perpendicular to the surface opposed to the channel layer 11a as in FIG. 7.

We can construct a magnetic detection apparatus provided with a plurality of magnetic sensors as described above. In this case, outputs of the respective magnetic sensors can be summed up. The magnetic detection apparatus of this configuration is applicable, for example, to a biological sensor for detecting cancer cells or the like. For example, the magnetic detection apparatus can be constructed by arranging a plurality of above-described magnetic sensors in parallel or in multilayer structure.

For example, in a magnetic head provided with a recording head part for writing, the aforementioned magnetic sensor can be applied to a reading head part. This can provide the magnetic head capable of detecting a magnetic flux from a microscopic region, for example, in a recording medium or the like.

The above described the present invention using the examples in which the channel layer 11, 11a, ferromagnetic layer 12, 12a, metal layer 13, 13a, insulating film 21, 21a, insulating film 22, 22a, magnetic shield layer S1, S1a, S2, S3, S4, and antiferromagnetic layer were so-called "layers" or "films," but the present invention is not limited only to this construction. These may be a channel, a ferromagnet, a metal body, an insulating body, a magnetic shield, and an antiferromagnet in various forms (e.g., spherical shape, cylindrical shape, or the like) as long as they can be used as constituents of the aforementioned magnetic sensor.

Examples will be described below, but it should be noted that the present invention is by no means limited to the examples below.

Example 1

Figure 8:
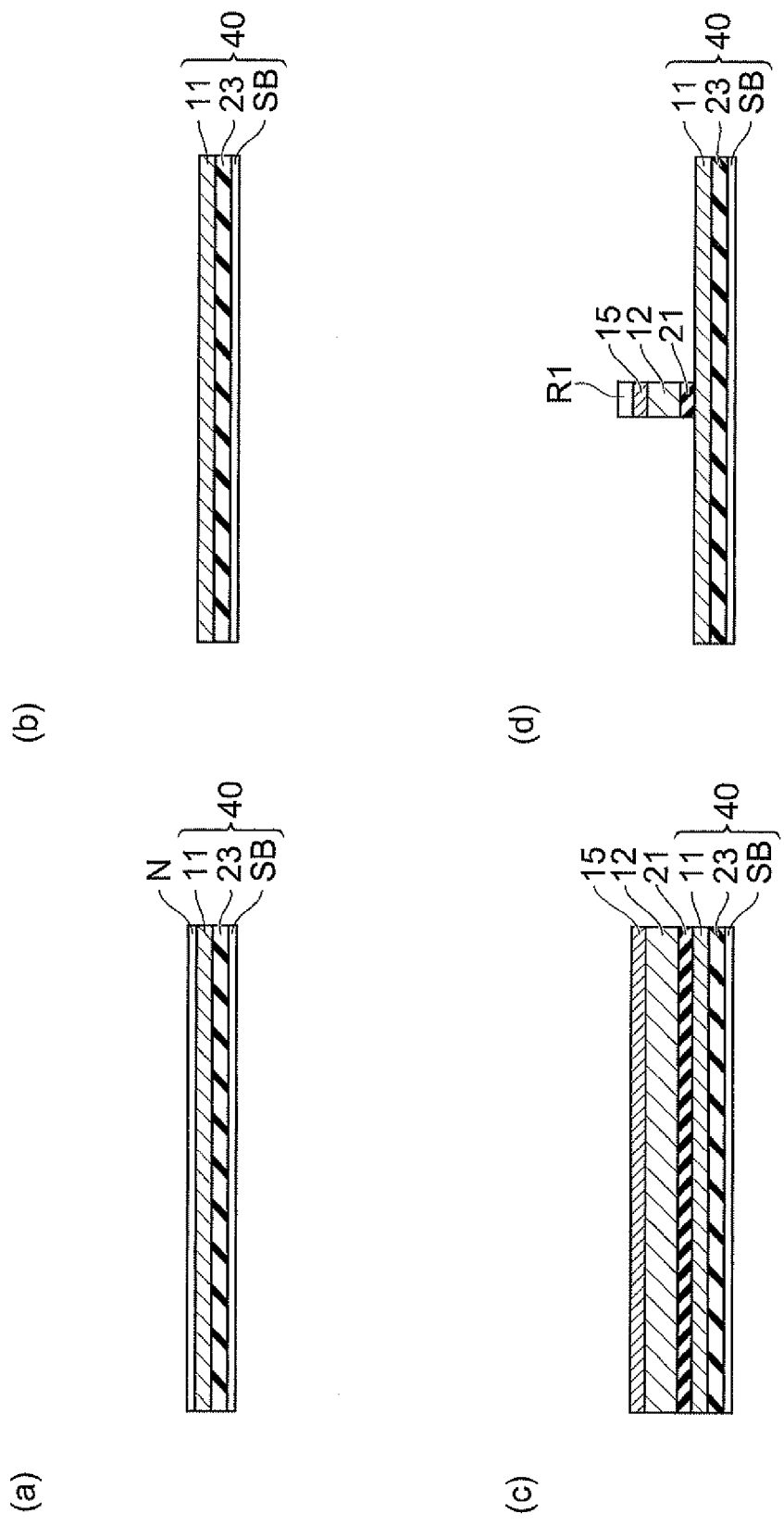
FIG. 8(a) is a schematic diagram showing a step of preparing an SOI substrate.
FIG. 8(b) is a schematic diagram showing a cleaning step.
FIG. 8(c) is a schematic diagram showing a step of laminating an insulating film, a ferromagnetic layer, and a protecting layer.
FIG. 8(d) is a schematic diagram showing a step of processing the insulating film, ferromagnetic layer, and protecting layer, using a first resist.

First, as shown in FIG. 8(a), an SOI substrate 40 consisting of a substrate SB, an insulating film 23, and a channel layer 11 was prepared. A silicon substrate was used as the substrate SB, a silicon oxide layer 200 nm thick as the insulating film 23, and a silicon layer 5 nm thick as the channel layer 11. Then the SOI substrate 40 was cleaned to remove extraneous matter, organic matter, and native oxide (N in FIG. 8(a)) from the surface of the channel layer 11, thereby obtaining the SOI substrate 40 shown in FIG. 8(b). A cleaning solution used herein was a diluted HF solution. Subsequently, as shown in FIG. 8(c), an insulating film 21, a ferromagnetic layer 12, and a protecting layer 15 were deposited in this order on the channel layer 11 by the MBE process. A magnesium oxide film was used as the insulating film 21, an iron layer as the ferromagnetic layer 12, and a titanium layer as the protecting layer 15. Thereafter, a first resist R1 was formed on the protecting layer 15 by the EB process. Using this first resist R1, ion milling and chemical etching were carried out to process the insulating film 21, ferromagnetic layer 12, and protecting layer 15 in a mesa shape, as shown in FIG. 8(d).

Figure 9:
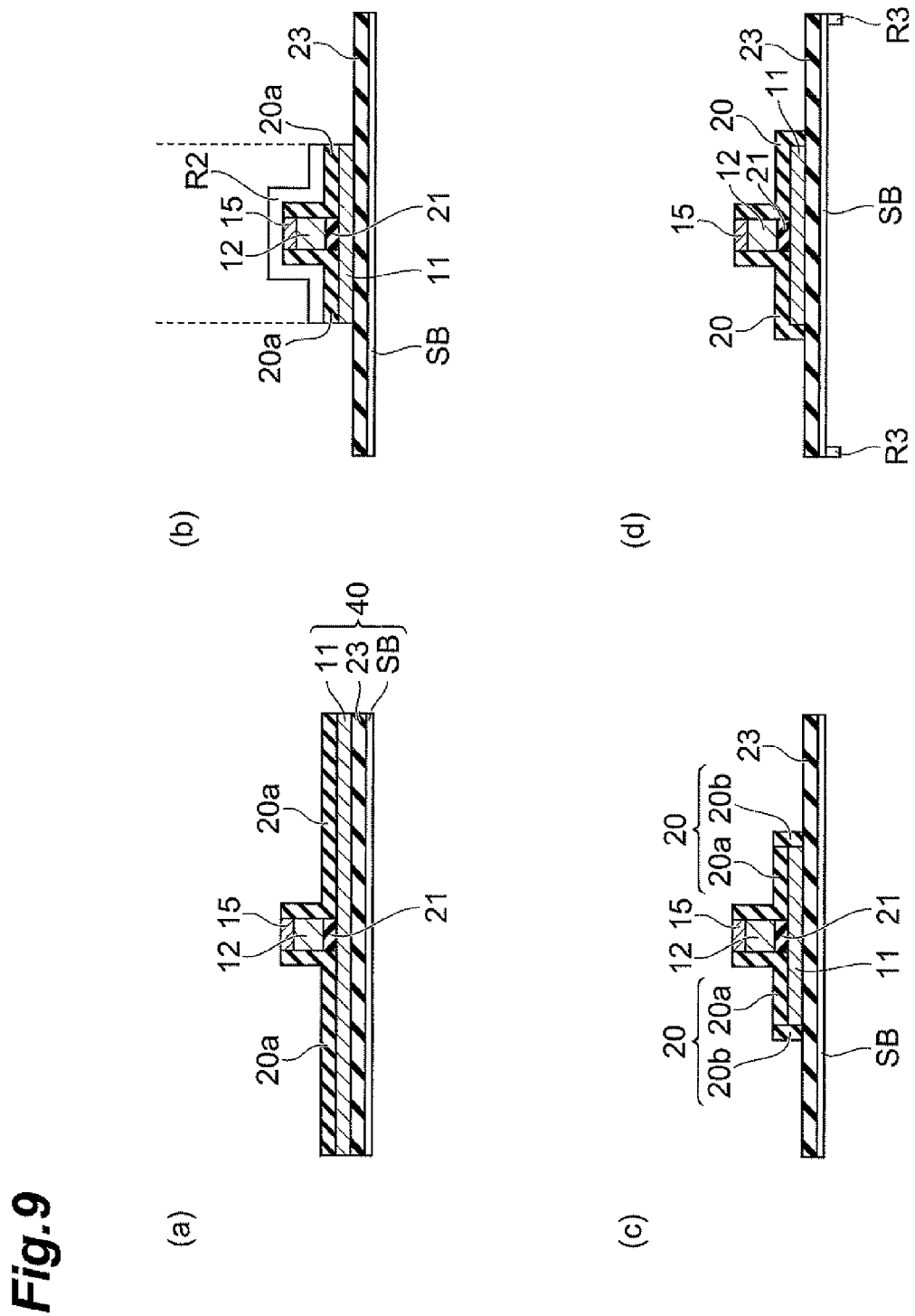
FIG. 9(a) is a schematic diagram showing a step of depositing an insulating film.
FIG. 9(b) is a schematic diagram showing a step of processing a channel layer, using a second resist.
FIG. 9(c) is a schematic diagram showing a step of forming an insulating film on side faces of the channel.
FIG. 9(d) is a schematic diagram showing a step of forming a third resist on a back surface of the substrate.

Thereafter, as shown in FIG. 9(a), a silicon oxide film was formed as the insulating film 20a in the thickness of 50 nm so as to cover the side faces of the insulating film 21, ferromagnetic layer 12, and protecting layer 15 and the top face of the channel layer 11. This step resulted in insulating the portions other than the top face of the protecting layer 15. Thereafter, the first resist R1 was peeled off. As shown in FIG. 9(b), a second resist was formed by the EB process. Using this second resist R2, ion milling and chemical etching were carried out to process the channel layer 11 and insulating film 20a. This step resulted in making the channel layer 11 in a rectangular shape when viewed from the thickness direction. As shown in FIG. 9(c), the second resist R2 was peeled off and the side faces of the channel layer 11 were made oxidized, thereby forming an insulating film 20b. The drawings hereinafter will show an insulating film 20 consisting of the insulating films 20a and 20b. As shown in FIG. 9(d), a third resist R3 was formed on the back surface of the substrate SB by the EB process. On this occasion, the third resist R3 was formed so as to cover portions other than the part to become the magnetic sensor.

Figure 10:
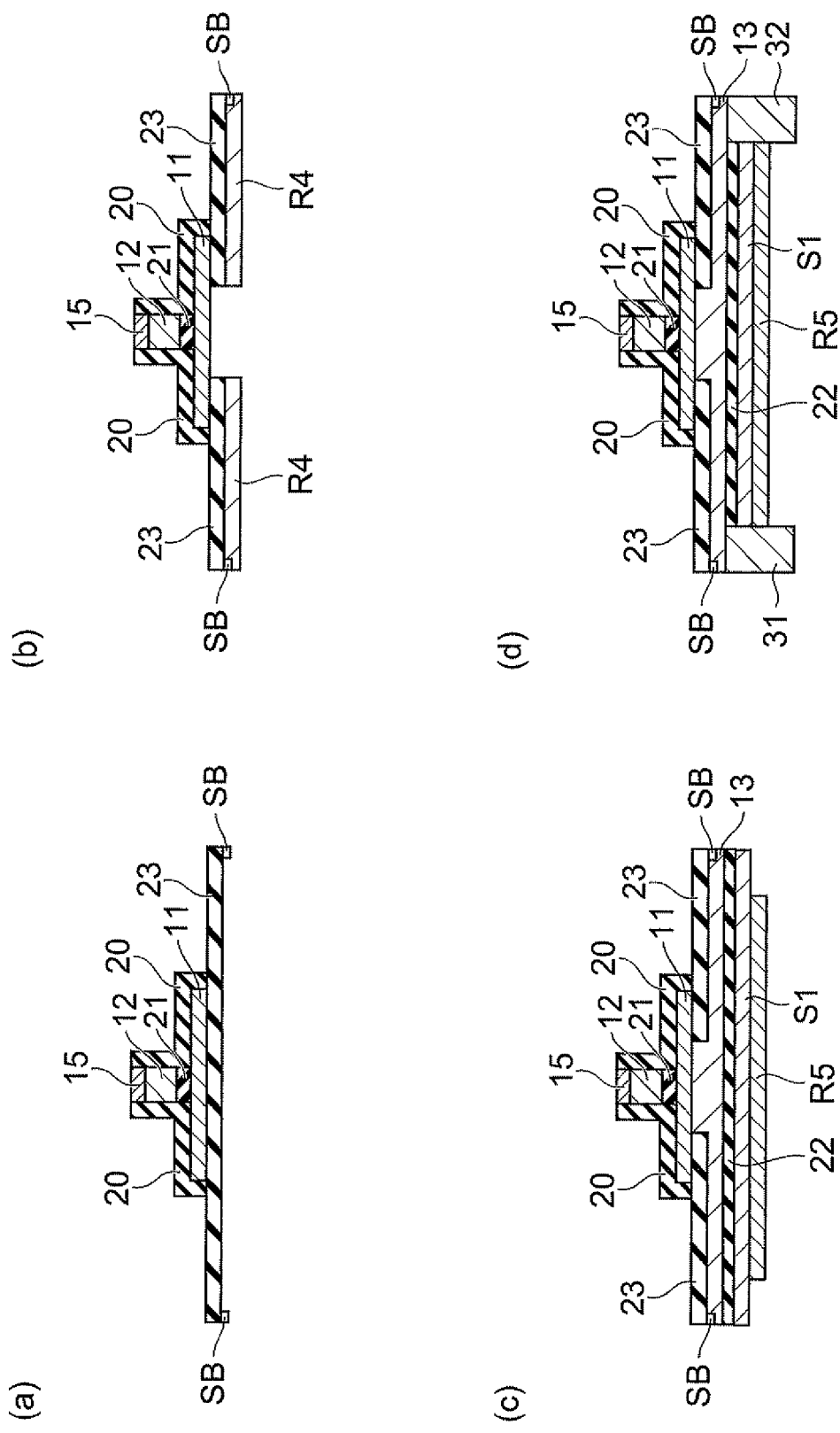
FIG. 10(a) is a schematic diagram showing a step of removing a part of the substrate.
FIG. 10(b) is a schematic diagram showing a step of removing a part of an insulating film of the SOI substrate, using a fourth resist.
FIG. 10(c) is a schematic diagram showing a step of forming a fifth resist, after deposition of a metal layer, an insulating film, and a magnetic shield layer.
FIG. 10(d) is a schematic diagram showing a step of forming first and second electrodes.

Subsequently, using the third resist R3, ion milling and chemical etching were carried out to remove a part of the substrate SB, as shown in FIG. 10(a). Thereafter, the third resist R3 being no longer necessary was removed. As shown in FIG. 10(b), a fourth resist R4 was formed and ion milling and chemical etching were carried out to remove a part of the insulating film 23. This step resulted in exposing a part of the bottom face of the channel layer 11. Thereafter, the fourth resist R4 being no longer necessary was peeled off. The exposed surface of the part of the bottom face of the channel layer 11 was cleaned by chemical etching. After the cleaning, as shown in FIG. 10(c), a metal layer 13 was formed by the MBE process so as to cover the exposed part of the bottom face of the channel layer 11 and the insulating film 23. Furthermore, an insulating film 22 and a magnetic shield layer S1 were deposited in this order on the bottom face of the metal layer 13. Thereafter, a fifth resist R5 for formation of reference electrodes was formed by the EB process.

Figure 11:
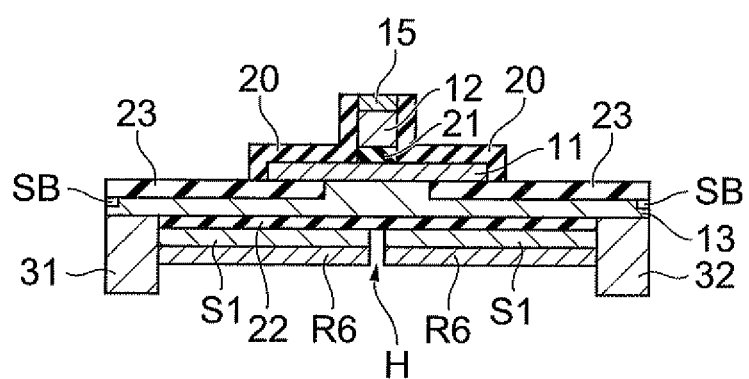
FIG. 11 is a schematic diagram showing a step of forming a through hole in the magnetic shield, using a sixth resist.

Next, using the fifth resist R5, ion milling was carried out to remove the magnetic shield layer S1 and the insulating film 22 and a metal film was deposited on removed parts, thereby forming a first reference electrode 31 and a second reference electrode 32, as shown in FIG. 10(d). Thereafter, the fifth resist R5 being no longer necessary was removed. Furthermore, as shown in FIG. 11, a sixth resist R6 for formation of through hole was formed by the EB process and, using this sixth resist R6, ion milling was carried out to process the magnetic shield layer S1, thereby forming a through hole H. Thereafter, the sixth resist R6 being no longer necessary was removed. It is noted that the well-known alignment technology can be applied to positioning in each of the above-described resist forming steps and film forming steps. The magnetic sensor 1 as shown in FIGS. 1 to 3 was manufactured by the above method.

Examples 2 to 5

In Examples 2 to 5, the magnetic sensors were manufactured in the same procedure as in Example 1 except for change in the thickness of the silicon layer being the channel layer 11. In Example 2 the thickness of the silicon layer was 10 nm; in Example 3 the thickness of the silicon layer 25 nm; in Example 4 the thickness of the silicon layer 50 nm; in Example 5 the thickness of the silicon layer 100 nm.

(Evaluation Results)

In each of the magnetic sensors manufactured in Examples 1 to 5, the magnetization direction G1 of the ferromagnetic layer 12 (X-axis direction in FIG. 2) was fixed so as to be nonparallel to the magnetic field direction of the external magnetic field B (Z-axis direction in FIG. 2). The ferromagnetic layer 12 and the first reference electrode 31 were connected to a current source 70. By adjusting the current source 70, a negative voltage was applied to the ferromagnetic layer 12 while a positive voltage was applied to the first reference electrode 31, thereby letting an electric current for detection of 0.1 mA flow into the ferromagnetic layer 12. By this, spins corresponding to the magnetization direction of the ferromagnetic layer 12 were injected into and accumulated in the channel layer 11. The external magnetic field B was applied through the through hole H to the channel layer 11. The output was evaluated with a voltage measuring device connected to the ferromagnetic layer 12 and the second reference electrode 32.

Figure 12:
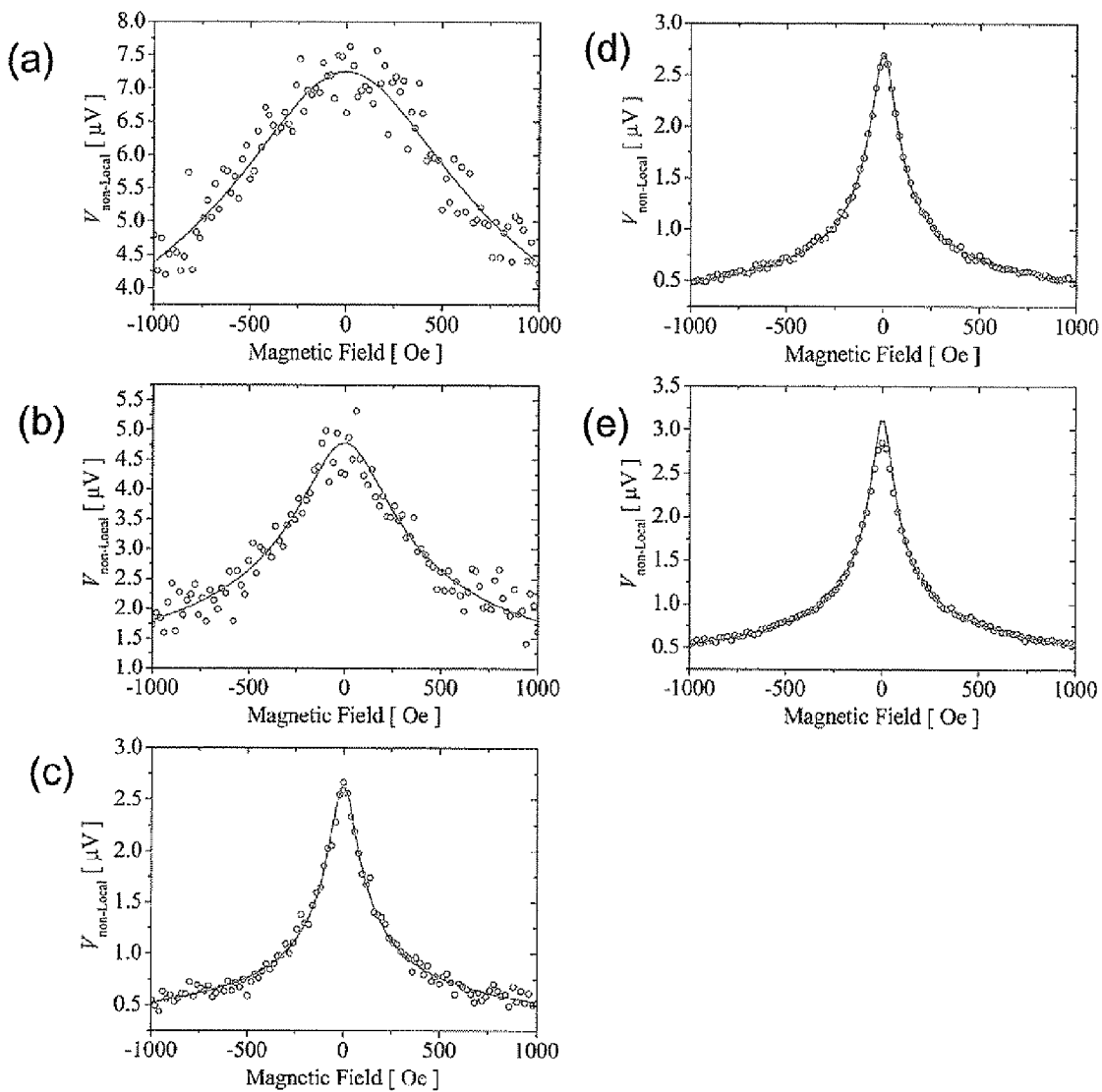
FIG. 12(a) to FIG. 12(e) are graphs showing relations of applied magnetic field versus output.

FIGS. 12(a) to 12(e) show relations of applied magnetic field versus output in the magnetic sensors manufactured in Examples 1 to 5, respectively. As shown in FIGS. 12(c) to 12(e), where the thickness of the silicon layer (channel layer) in Examples 3 to 5 was 25 nm, 50 nm, or 100 nm, the potential output at zero of the applied magnetic field was approximately 2.7 µV-3 µV. As shown in FIGS. 12(a) and 12(b), where the thickness of the silicon layer (channel layer) in Examples 1 and 2 was 5 nm or 10 nm, the potential output at zero of the applied magnetic field was approximately 5 µV-7.75 µV.

Figure 13:
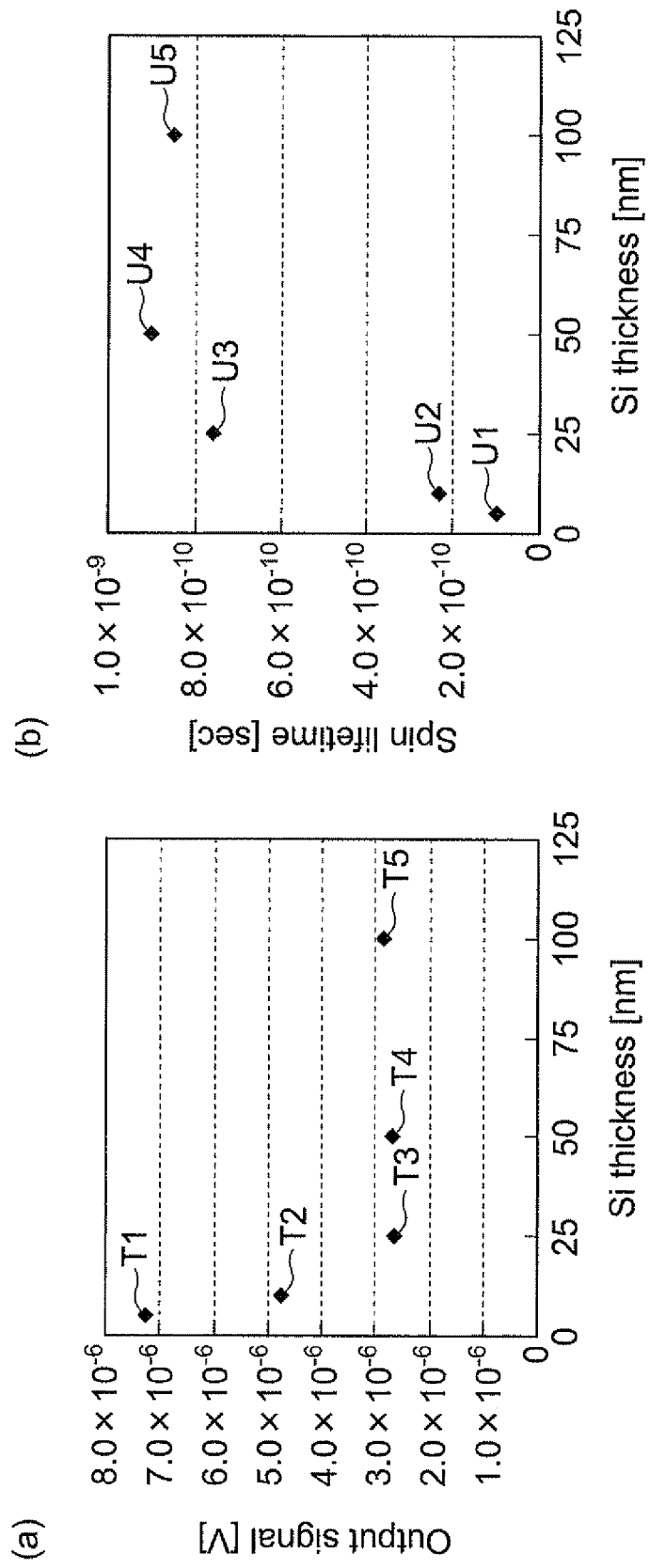
FIG. 13(a) is a graph showing a relation of thickness of Si versus output.
FIG. 13(b) is a graph showing a relation of thickness of Si versus spin lifetime.

FIG. 13(a) is a graph showing a relation of thickness of the silicon layer versus output. T1-T5 in FIG. 13(a) correspond to respective measurements in Examples 1-5. It is seen that the potential output is higher in the cases where the thickness of the silicon layer (channel layer) is not more than 10 nm as indicated by T1 and T2 than in the cases where the thickness of the silicon layer (channel layer) is larger than 10 nm as indicated by T3-T5.

FIG. 13(b) is a graph showing a relation of thickness of the silicon layer versus spin lifetime. U1-U5 in FIG. 13(b) correspond to respective measurements in Examples 1 to 5. It is seen that the spin lifetime is shorter in the cases where the thickness of the silicon layer (channel layer) is not more than 10 nm as indicated by U1 and U2 than in the cases where the thickness of the silicon layer (channel layer) is larger than 10 nm as indicated by U3 to U5.

LIST OF REFERENCE SIGNS 1, 2, 3, 4 magnetic sensor; 11, 11a channel layer; 12, 12a ferromagnetic layer; 13, 13a metal layer; 21, 21a, 22, 22a insulating film; 31, 31a first reference electrode; 32, 32a second reference electrode; S1, S1a, S2, S3, S4 magnetic shield layer; H through hole; 18 permanent magnet.

What is claimed is:

1. A magnetic sensor comprising:
   a channel composed of a semiconductor;
   a first insulating film and a metal body arranged opposite to each other with the channel in between;
   a ferromagnet provided on the first insulating film;
   a first reference electrode connected to the metal body;
   a second reference electrode connected to the metal body;
   a magnetic shield covering a portion opposed to the ferromagnet in the channel; and
   a second insulating film provided between the channel and the magnetic shield,
   wherein the magnetic shield has a through hole extending toward said portion opposed to the ferromagnet in the channel.

2. The magnetic sensor according to claim 1, wherein a thickness of the channel is not more than 10 nm.

3. The magnetic sensor according to claim 1, wherein a junction between the channel and the metal body is a Schottky junction.

4. The magnetic sensor according to claim 1, wherein an axis direction of the through hole is nonparallel to a magnetization direction of the ferromagnet.

5. The magnetic sensor according to claim 1, wherein when viewed from an axis direction of the through hole, an entire cross section of the through hole is opposed to the channel.

6. The magnetic sensor according to claim 1, wherein a material of the metal body is Al, Gd, or Yb.

7. The magnetic sensor according to claim 1, wherein a material of the metal body is CoFe or $Fe_3Si$.

8. The magnetic sensor according to claim 1, wherein a material of the ferromagnet is a metal selected from the group consisting of Cr, Mn, Co, Fe, and Ni, an alloy containing at least one element in the group, or a compound containing at least one element selected from the group, and at least one element selected from the group consisting of B, C, N, Si, and Ge.

9. The magnetic sensor according to claim 1, wherein a material of the channel is a semiconductor containing any one of Si, Ge, GaAs, C, and ZnO.

10. The magnetic sensor according to claim 1, wherein a material of the first insulating film is magnesium oxide, aluminum oxide, magnesium aluminum oxide, zinc oxide, or gallium oxide.

11. The magnetic sensor according to claim 1, wherein a magnetization direction of the ferromagnet is fixed by an antiferromagnet provided on the ferromagnet.

12. The magnetic sensor according to claim 1, further comprising a permanent magnet which supplies to the through hole, a magnetic field in the same direction as an axis direction of the through hole.

13. A magnetic detection apparatus comprising a plurality of magnetic sensors as defined in claim 1.

* * * * *